US012568732B2

(12) United States Patent
Wu

(10) Patent No.: US 12,568,732 B2
(45) Date of Patent: Mar. 3, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Yongbo Wu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 455 days.

(21) Appl. No.: 18/266,719

(22) PCT Filed: Mar. 24, 2023

(86) PCT No.: PCT/CN2023/083903
§ 371 (c)(1),
(2) Date: Jun. 12, 2023

(87) PCT Pub. No.: WO2024/016710
PCT Pub. Date: Jan. 25, 2024

(65) Prior Publication Data
US 2024/0032333 A1 Jan. 25, 2024

(30) Foreign Application Priority Data

Jul. 21, 2022 (CN) .......................... 202210863849.6

(51) Int. Cl.
*H10K 59/12* (2023.01)
*H10K 59/38* (2023.01)
(Continued)

(52) U.S. Cl.
CPC ......... *H10K 59/1201* (2023.02); *H10K 59/38* (2023.02); *H10K 59/40* (2023.02); *H10K 59/873* (2023.02); *H10K 2102/302* (2023.02)

(58) Field of Classification Search
None
See application file for complete search history.

(56) References Cited

U.S. PATENT DOCUMENTS

2019/0036073 A1 1/2019 Yu et al.
2022/0199691 A1* 6/2022 Shin ...................... G06F 3/0448

FOREIGN PATENT DOCUMENTS

CN 104112764 A 10/2014
CN 104865735 A 8/2015
(Continued)

OTHER PUBLICATIONS

PCT International Search Report for International Application No. PCT/CN2023/083903, mailed on May 24, 2023, 9pp.
(Continued)

*Primary Examiner* — Kyoung Lee
(74) *Attorney, Agent, or Firm* — The Roy Gross Law Firm, LLC; Roy D. Gross

(57) ABSTRACT

The disclosure provides a display panel and a display device. The display panel includes a light emitting device layer; an encapsulation layer on the light emitting device layer; a touch control layer on the encapsulation layer; a protective layer on the touch control layer; and a color filter layer including a light shielding layer on the protective layer; and the protective layer is provided with at least one groove located in the non-display area, and the at least one groove extends along at least one side of the display area.

20 Claims, 3 Drawing Sheets

(51) Int. Cl.
  *H10K 59/40*        (2023.01)
  *H10K 59/80*        (2023.01)
  *H10K 102/00*       (2023.01)

(56)                References Cited

FOREIGN PATENT DOCUMENTS

| CN | 108333833 A | 7/2018 |
|----|-------------|--------|
| CN | 110211998 A | 9/2019 |
| CN | 110400891 A | 11/2019 |
| CN | 111755490 A | 10/2020 |
| CN | 112667106 A | 4/2021 |
| CN | 113219700 A | 8/2021 |
| CN | 113327964 A | 8/2021 |
| CN | 115275051 A | 11/2022 |

OTHER PUBLICATIONS

PCT Written Opinion of the International Searching Authority for International Application No. PCT/CN2023/083903, mailed on May 24, 2023, 9pp.
Chinese Office Action issued in corresponding Chinese Patent Application No. 202210863849.6 dated Mar. 25, 2023, pp. 1-6, 14pp.

\* cited by examiner

1000

DISPLAY PANEL AND DISPLAY DEVICE

CROSS REFERENCE TO RELATED APPLICATIONS

This application is a National Phase of PCT Patent Application No. PCT/CN2023/083903 having international filing date of Mar. 24, 2023, which claims priority to and the benefit of Chinese Patent Application No. 202210863849.6 filed on Jul. 21, 2022. The contents of the above applications are all incorporated by reference as if fully set forth herein in their entirety.

TECHNICAL FIELD

The present disclosure relates to a technical field of display, and in particular to a display panel and a display device.

BACKGROUND

In a conventional organic light emitting diode (OLED) display panel, a color filter is used instead of a conventional polarizer to achieve a higher transmittance. Since the light-shielding layer of the color filter includes an organic photoresist material, it is easy to absorb water. When the external moisture penetrates into the interior of the display panel through the light-shielding layer, the light-shielding layer easily falls off from the substrate under the action of the high temperature, thereby generating bubbles.

SUMMARY

Technical Problem

An embodiment of the present disclosure provides a display panel and a display device, which may improve the technical problem that bubbles are generated at a light shielding layer of the display panel due to moisture invasion.

Technical Solution

An embodiment of the present disclosure provides a display panel including a display area and a non-display area around at least one side of the display area, the display panel includes a light emitting device layer including a plurality of light emitting portions located in the display area; an encapsulation layer on the light emitting device layer; a touch layer on the encapsulation layer; a protective layer on the touch layer; and a color filter layer including a light shielding layer and a color resist layer, the light shielding layer including a body portion located in the display area and an extension portion located in the non-display area, the body portion and the extension portion being on the protective layer, the body portion being provided with a plurality of openings, the color resist layer including a plurality of color resistors, and at least one of the color resistors being located in a corresponding opening of the plurality of openings and facing corresponding color resistors; and the protective layer is provided with at least one groove located in the non-display area, and the at least one groove extends along at least one side of the display area.

In some embodiments, a first filling portion is provided in the at least one groove, and a material of the first filling portion is different from that of the protective layer.

In some embodiments, the material of the first filling portion is the same as that of the body portion, and the first filling portion is disposed space apart from the body portion.

In some embodiments, a second filling portion is further provided in the at least one groove, the second filling portion covers the first filling portion, and a material of the second filling portion is different from materials of the first filling portion and the protective layer.

In some embodiments, the second filling portion is the color resistor, a top surface of the second filling portion away from the first filling portion is beyond a top surface of the extension portion away from the protective layer, a top surface of the first filling portion away from the touch control layer is located between a bottom surface of the protective layer close to the touch control layer and a top surface of the protective layer away from the touch control layer, and colors of color resistors in at least two adjacent grooves are different.

In some embodiments, a third filling portion is further provided in the at least one groove, the third filling portion covers the first filling portion and the extension portion, a top surface of the third filling portion away from the extension portion is a flat surface.

In some embodiments, a second filling portion is provided in the at least one groove, the second filling portion includes a first portion, a second portion located on the first portion, a third portion located on the second portion, the first portion, the second portion and the third portion differ in material, an interface between the first portion and the second portion is located between a bottom surface of the protective layer close to the touch control layer and a top surface of the protective layer away from the touch control layer, and an interface between the second portion and the third portion is located between a bottom surface of the extension portion close to the protective layer and a top surface of the extension portion away from the protective layer.

In some embodiments, the plurality of color resistors includes a red color resistor, a blue color resistor, and a green color resistor, the first portion is the blue color resistor, the second portion is the red color resistor, and the third portion is the green color resistor.

In some embodiments, a second filling portion is provided in the at least one groove, the display area includes two opposing first sides and two opposing second sides, the first sides intersect with the second sides, a plurality of grooves are arranged around the display area, materials of the second filling portions in at least two adjacent grooves are different, each of the grooves includes a first section close to the first side and a second section close to the second side, the first section and the second section are disposed space apart from each other at the junction of the first side and the second side, an arrangement order of a plurality of first sections close to one of the first sides is opposite to an arrangement order of a plurality of first sections close to another of the first sides, and an arrangement order of a plurality of second sections close to one of the second sides is opposite to an arrangement order of a plurality of the second sections close to another of the second sides.

In some embodiments, the display panel further includes a barrier wall located within the non-display area, the encapsulation layer includes a first inorganic layer, a second inorganic layer, and an organic layer located between the first inorganic layer and the second inorganic layer, the first inorganic layer and the second inorganic layer are located over the barrier wall, the organic layer is located at a side of the barrier wall close to the display area, and the at least one groove is located at a side of the barrier wall away from the display area.

In some embodiments, a thickness of the extension portion ranges from 1 micron to 1.5 micron, a depth of the groove is 3 to 4 times the thickness of the extension portion, and a width of the groove is larger than 10 micron.

In some embodiments, distances between a plurality of grooves are gradually reduced in the direction from the display area to the non-display area.

An embodiment of the present disclosure further provides a display device including the display panel as described above.

Beneficial Effect

In comparison with the prior art, in the display panel and the display device provided in the embodiments of the present disclosure, since moisture generally penetrates from the interface of the film layers, a groove is provided in the protective layer on the touch control layer, so that the path through which the moisture penetrates from the interface of the protective layer and the light shielding layer may be extended, thereby improving the abnormal phenomenon of bubbles generated at the light shielding layer.

DETAILED DESCRIPTION

In order to make the objects, technical solutions, and effects of the present disclosure clearer and more explicit, the present disclosure will be described in further detail below with reference to the accompanying drawings and embodiments. It is to be understood that the specific embodiments described herein are merely illustrative of the present disclosure and are not intended to limit the present disclosure.

Figure 1:
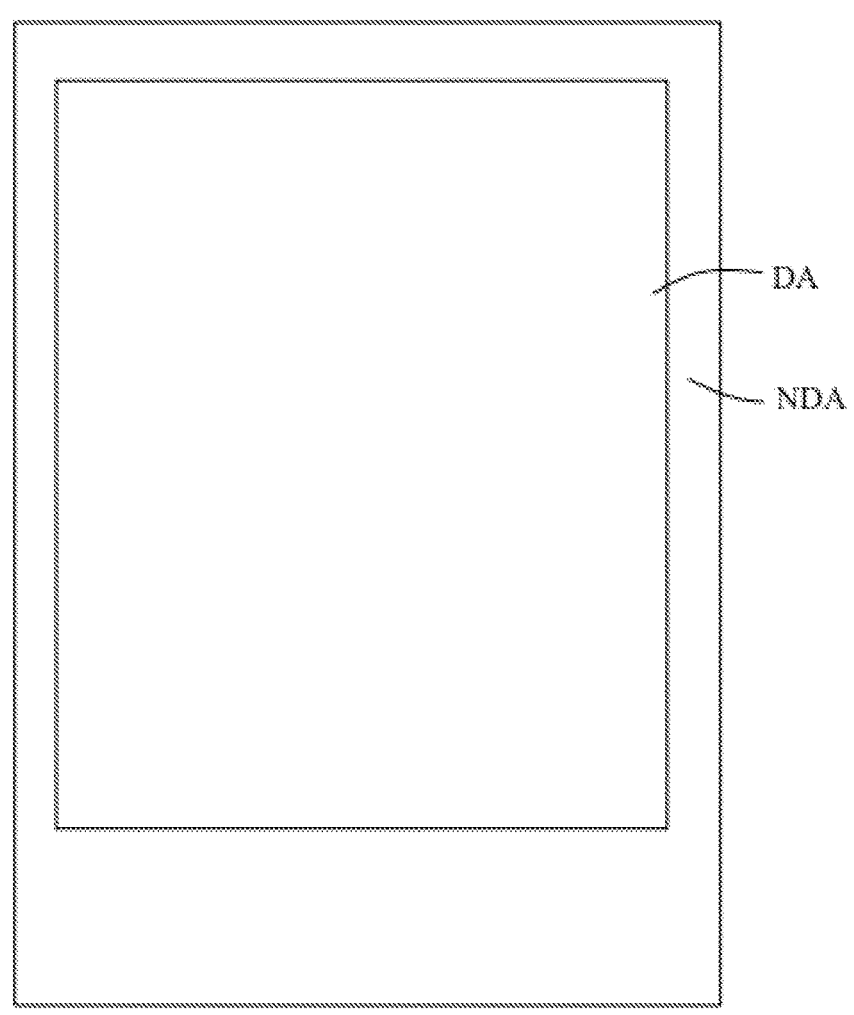
FIG. 1 is a schematic top view of a display panel according to an embodiment of the present disclosure.

As shown in FIG. 1, an embodiment of the present disclosure provides a display panel 1000, which may be an organic light emitting diode (OLED) display panel, a micro light emitting diode display panel, or a mini light emitting diode display panel. Illustratively, the display panel 1000 is an OLED display panel.

The display panel 1000 includes a display area DA and a non-display area NDA. The display area DA may be an area for arranging sub-pixels for displaying image. The non-display area NDA may be an area where a driving unit, such as a gate driving circuit, for providing a driving signal to a pixel driving circuit of a sub-pixel, and some wires for providing a signal to the driving unit are arranged. Within the non-display area NDA, there are generally no sub-pixels provided for display. The non-display area NDA may be disposed on at least one side of the display area DA to at least partially surround the display area DA.

Figure 2:
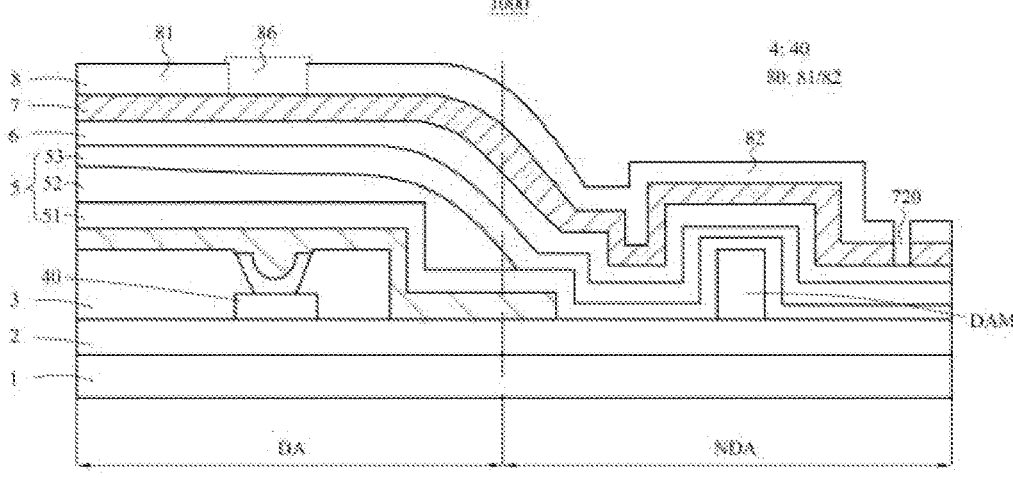
FIG. 2 is a schematic cross-sectional view of the display panel of FIG. 1.

Referring to FIG. 2, the display panel 1000 includes a substrate 1, a pixel driving circuit layer 2 on the substrate 1, a pixel defining layer 3 on the pixel driving circuit layer 2, a light emitting device layer 4 on the pixel driving circuit layer 2, an encapsulation layer 5 on the light emitting device layer 4, a touch control layer 6 on the encapsulation layer 5, a protective layer 7 on the touch control layer 6, and a color film layer 8 on the protective layer 7.

The substrate 1 is used for supporting a film layer disposed thereon. The substrate 1 may include a single-layer insulating material such as glass, quartz, and a polymer resin, or a multi-layer insulating material such as a double-layer polymer resin. The substrate 1 may be a rigid substrate 1 or a flexible substrate 1.

The pixel driving circuit layer 2 is used for driving the light emitting device layer 4 to emit light. The pixel driving circuit layer 2 includes a semiconductor layer and a plurality of metal layers to form at least one capacitor and a plurality of thin film transistors, which are used to form a plurality of pixel drive circuits. Illustratively, at least one of the pixel drive circuits may include the at least one of the capacitors and the plurality of the thin film transistors.

The pixel defining layer 3 may include a resin such as polyacrylates or polyimides, a silica-based inorganic substance, and the like. The pixel defining layer 3 is provided with a plurality of openings.

The light emitting device layer 4 includes a plurality of light emitting portions 40 located in the display area DA. At least part of the light emitting portion is located in the corresponding opening. Each of the light emitting portions 40 includes a first electrode, a light emitting unit, and a second electrode. The first electrode may be an anode having a laminated film structure in which a material layer with a higher work function, such as indium tin oxide (ITO: Indium-Tin-Oxide), indium zinc oxide (IZO: Indium-Zinc-Oxide), zinc oxide (ZnO), indium oxide (In2O3: Induim Oxide), and a reflective material layer, such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a mixture thereof, are laminated, but it is not limited thereto. The light emitting unit may include an organic light emitting portion, and may further include a hole injection/transport portion and/or an electron injection/transport portion. The second electrode may be a cathode, and the cathodes of the plurality of light emitting portions may be connected to each other to form an integrated electrode. The cathode may include a material layer having a smaller work function, such as Li, Ca, LiF/Ca, LiF/Al, Al, Mg, Ag, Pt, Pd, Ni, Au, Nd, Ir, Cr, BaF2, Ba or a compound or mixture thereof (e.g., a mixture of Ag and Mg, etc.). The cathode may also include a transparent metal oxide layer disposed on the material layer having the smaller work function.

The encapsulation layer 5 may include at least one inorganic layer and at least one organic layer. In some embodiments, the encapsulation layer 5 may include a first inorganic layer 51 and a second inorganic layer 53, and an organic layer 52 therebetween. The first inorganic layer 51 and the second inorganic layer 53 may include at least one inorganic insulating material of aluminum oxide, titanium oxide, tantalum oxide, hafnium oxide, zinc oxide, silicon oxide, silicon nitride, and silicon oxynitride. The organic layer 52 may include a polymer material. Examples of polymer material may include acrylic resin, epoxy resin, polyimide, and/or polyethylene.

The touch control layer 6 may realize a touch control function by self-capacitance or mutual capacitance.

The protective layer 7 is used for protecting the touch control layer 6. The protective layer 7 includes polyimide-based organic photoresist, and may have a thickness of 4 microns to 5 microns.

The color filter layer 8 serves to reduce interference of ambient light, and includes a light shielding layer 80 and a color resist layer. The light shielding layer 80 may include a black photoresist material, and include a body portion 81 located in the display area DA and an extension portion 82 located in the non-display area NDA. The body portion 81 is provided with a plurality of openings, and the extension portion 82 has a thickness of 1 micron to 1.5 micron. The color resist layer may include a pigment-doped photoresist material, and include a plurality of color resistors 86, and at least one of the color resistors 86 is located within a corresponding opening and facing the corresponding light emitting portion 40. The extension portion 82 is provided with at least one groove 720 located in the non-display area NDA, and the at least one groove 720 extends along at least one side of the display area DA. In view of the characteristics of the material of the light shielding layer, the contact width between the light shielding layer and the lower layer material is too small, which may make the light shielding layer easy to fall off, so that the width of the groove 720 is set to be greater than 10 microns.

The display panel 1000 further includes a barrier wall DAM located within the non-display area NDA, and the pixel defining layer 3 or a planarization layer of the pixel driving circuit layer 2 may include at least a portion of the barrier wall DAM. The first inorganic layer 51 and the second inorganic layer 53 of the encapsulation layer 5 are located over the barrier wall DAM, the organic layer 52 is located at a side of the barrier wall DAM that is close to the display area DA, and at least one of the grooves 720 is located at a side of the barrier wall DAM that is far from the display area DA.

In the display panel 1000 provided in the embodiment of the present disclosure, by providing a groove 720 in the protective layer 7 for protecting the touch layer 6, a penetrating path of moisture from the interface between the protective layer 7 and the light shielding layer 80 may be extended, thereby improving an abnormal phenomenon that the bubbles generated at the light shielding layer 80 under the action of high temperature. Further, the groove 720 is located at the side of the barrier wall DAM away from the display area DA, so that moisture may be further prevented from affecting the light emitting layer.

Figure 3A:
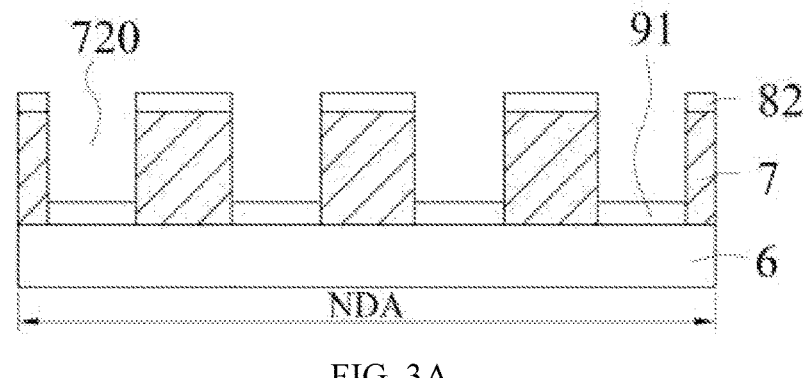
FIG. 3A is a schematic cross-sectional view of a display panel in a non-display area according to an embodiment of the present disclosure.

In other embodiments, referring to FIG. 3A, at least one of the grooves 720 is provided with a first filling portion 91, and a material of the first filling portion 91 is different from that of the protective layer 7. In this way, the moisture from the outside also needs to pass through the interface between the first filling portion 91 and the protective layer 7 to penetrate into the body portion 81 located in the display area DA of the light shielding layer 80, thereby further increasing the moisture resistance.

Illustratively, the first filling portion 91 and the body portion 81 are provided at intervals and include the same material. The depth of the groove 720 is 3 to 4 times the thickness of the extension portion 82, so that the first filling portion 91 falling into the groove 720 is disconnected from the body portion 81. Thus, by disconnecting the light shielding layer 80 to fill the groove 720, material of the first filling portion 91 may be saved.

Figure 3B:
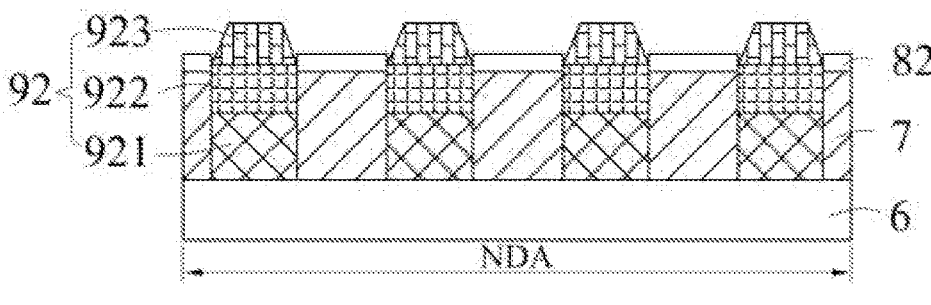
FIG. 3B is a schematic cross-sectional view of a display panel in a non-display area according to an embodiment of the present disclosure.

In other embodiments, referring to FIG. 3B, at least one of the grooves 720 is provided with a second filling portion 92 including a first portion 921, a second portion 922 on the first portion 921, and a third portion 923 on the second portion 922, and the first portion 921, the second portion 922, and the third portion 923 include different materials. An interface between the first portion 921 and the second portion 922 is located between a bottom surface of the protective layer 7 close to the touch control layer 6 and a top surface of the protective layer 7 away from the touch control layer 6, an interface between the second portion 922 and the third portion 923 is located between a bottom surface of the extension 82 close to the protective layer 7 and a top surface of the extension 82 away from the protective layer 7, and a top surface of the third portion 923 away from the second portion 922 is beyond the top surface of the extension 82 away from the protective layer 7. Thus, a plurality of interfaces (i.e., the interface between the first portion 921 and the second portion 922, and the interface between the second portion 922 and the third portion 923) are formed in the vertical direction, and a plurality of interfaces in the horizontal direction are offset from each other, so that the moisture blocking effect may be further enhanced.

The plurality of color resistors 86 include a red color resistor, a blue color resistor, and a green color resistor. The first portion 921 is the blue color resistor, the second portion 922 is the red color resistor, and the third portion 923 is the green color resistor. Thus, by filling the groove 720 with the color resist layer, the material may be saved. Moreover, the first portion 921, the second portion 922, and the third portion 923 are made of the same main body material, and have fewer defects at the interfaces therebetween. The waterproof performance is superior to that at the interface between the protective layer 7 and the extension portion 82, so that the waterproof effect may be further ensured. In addition, the red, green, and blue color resistors which are stacked may also enhance the light shielding effect at the grooves 720.

Figure 4A:
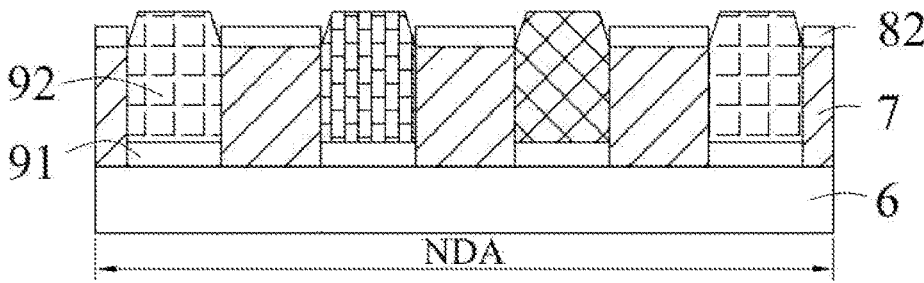
FIG. 4A is a schematic cross-sectional view of a display panel in a non-display area according to an embodiment of the present disclosure.

In other embodiments, referring to FIG. 4A, the groove 720 is further filled with a second filling portion 92, which is filled in the corresponding groove 720 and covers the first filling portion 91, and the second filling portion 92 has a material different from that of the first filling portion 91 and the protective layer 7.

Illustratively, the second filling portion 92 is the color resistor 86, and the colors of the color resistors 86 in the two adjacent grooves 720 are different. A top surface of the second filling portion 92 away from the first filling portion 91 is beyond the top surface of the extension portion 82 away from the protective layer 7, and the top surface of the first filling portion 91 away from the touch control layer 6 is located between the bottom surface of the protective layer 7 close to the touch control layer 6 and the top surface of the protective layer 7 away from the touch control layer 6. Thus, by filling the groove 720 with the color resist layer, the material may be saved. The materials may be saved, and the process is simpler.

Figure 4B:
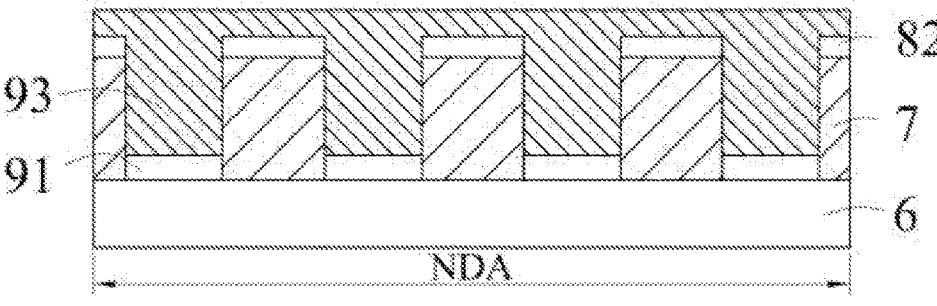
FIG. 4B is a schematic cross-sectional view of a display panel in a non-display area according to an embodiment of the present disclosure.

In other embodiments, referring to FIG. 4B, the groove 720 is further filled with a third filling portion 93, which covers the first filling portion 91 and the extension portion 82. A top surface of the third filling portion 93 away from the extension portion 82 is a flat surface. The third filling portion 93 may be an OC (Over Coating) layer. In this way, the film layer in the non-display area NDA may be made more flat.

Figure 5:
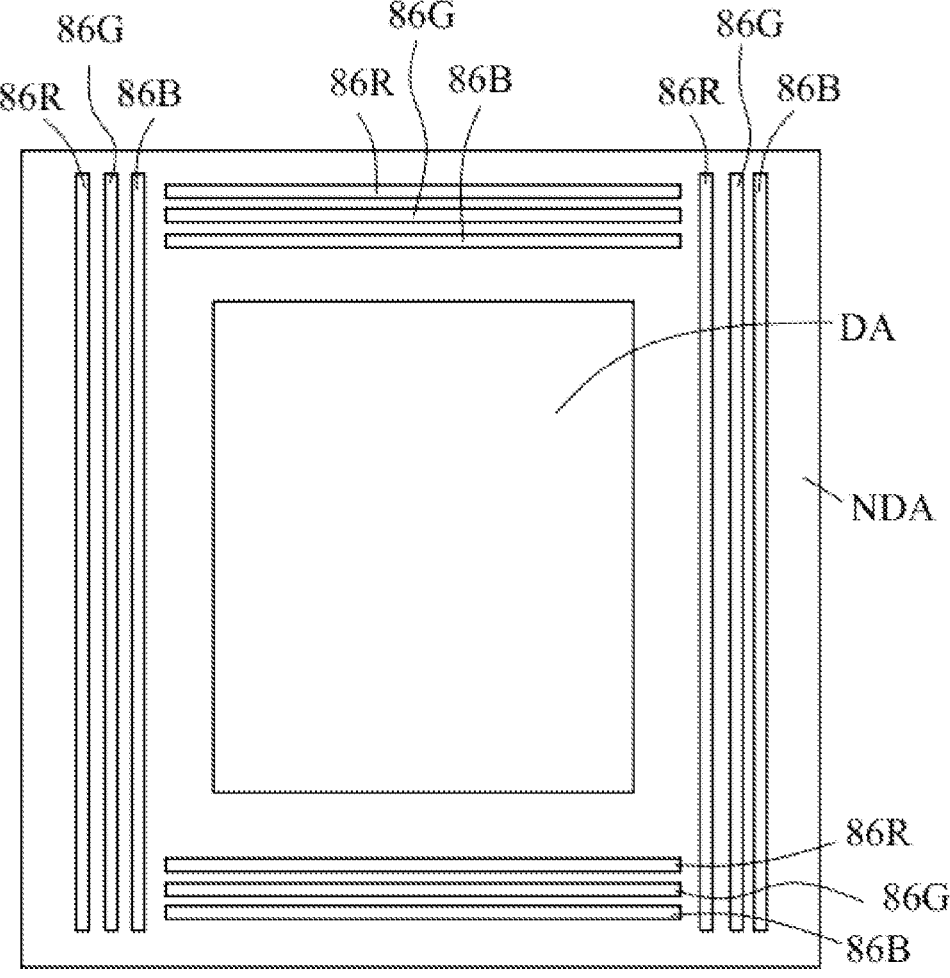
FIG. 5 is a schematic top view of a display panel according to an embodiment of the present disclosure.

In other embodiments, referring to FIGS. 2, 4A and 5, the display area DA is generally rectangular in shape and includes two opposing first sides and two opposing second sides, the first side intersects with the second side, a plurality of the grooves 720 are around the display area DA, and the second filling portions 92 within the plurality of the grooves 720 include different materials. For example, at least two of the grooves 720 are filled with the color resistors 86 of different colors, such as a blue color resistor 86B, a red color resistor 86R and a green color resistor 86G. Each of the grooves 720 includes a first section near the first side and a second section near the second side, the first section and the second section are provided at intervals at the junction of the first side and the second side. The arrangement order of the plurality of the first sections close to one of the first sides is opposite to the arrangement order of the plurality of the first sections close to another of the first sides, and the arrangement order of the plurality of the second sections close to one of the second sides is opposite to the arrangement order of the plurality of the second sections close to another of the second sides, in a direction from the display area DA to the non-display area NDA. Thus, by disconnecting the groove 720, the moisture penetrating path may be further extended.

In other embodiments, distances between the plurality of the grooves 720 are gradually reduced in the direction from the display area DA to the non-display area NDA. In this way, denser grooves 720 are provided in the area closer to the outside moisture, so that the moisture blocking effect may be enhanced.

In a possible embodiment, the display panel 1000 is further provided with a moisture storage groove extending through at least the protective layer 7 and the extension portion 82, a depth of the moisture storage groove is greater than the depth of the grooves 720, the distance between the moisture storage groove and the outermost groove 720 is greater than the distance between two adjacent grooves 720, the moisture storage groove is provided with a water absorbing material. In this way, the water storage groove for storing the external moisture is provided in advance, so that the moisture penetrated into the surface may be reduced.

An embodiment of the present disclosure further provides a display device including the display panel 1000 described above. The display device is a device having a display function, illustratively, the display device may be a device for displaying a video or still image, including a fixed terminal such as a television, a desktop computer, a monitor, a billboard, or may include a mobile terminal such as a mobile phone, a tablet computer, a mobile communication terminal, an electronic notebook, an electronic book, a multimedia player, a navigator, a notebook computer, or may include a wearable electronic device such as a smart watch, smart glasses, a virtual reality device, an augmented reality device.

The principles and embodiments of the present disclosure have been described with reference to specific embodiments, and the description of the above embodiments is merely intended to aid in the understanding of the method of the present disclosure and its core idea. At the same time, changes may be made by those skilled in the art to both specific implementations and the scope of application in accordance with the teachings of the present disclosure. In view of the foregoing, the content of the present specification should not be construed as limiting the disclosure.

What is claimed is:

1. A display panel comprising a display area and a non-display area surrounding at least one side of the display area, wherein the display panel comprises:
   a light emitting device layer comprising a plurality of light emitting portions located in the display area;
   an encapsulation layer on the light emitting device layer;
   a protective layer on the encapsulation layer; and
   a color filter layer disposed on the protective layer, the color filter layer comprising a light shielding layer and a color resist layer, the light shielding layer comprising a body portion located in the display area and an extension portion located in the non-display area, the body portion being provided with a plurality of openings corresponding to the plurality of light emitting portions, the color resist layer comprising a plurality of color resistors, and at least one of the color resistors being located in a corresponding opening of the plurality of openings, and
   wherein the protective layer is provided with at least one groove located in the non-display area, and the light shielding layer is disconnected at the at least one groove in the non-display area.

2. The display panel according to claim 1, wherein a first filling portion is provided in the at least one groove, and a material of the first filling portion is different from a material of the protective layer.

3. The display panel according to claim 2, wherein the material of the first filling portion is the same as that of the body portion, and the first filling portion is disposed space apart from the body portion.

4. The display panel according to claim 2, wherein a second filling portion is further provided in the at least one groove, the second filling portion covers the first filling portion, and a material of the second filling portion is different from materials of the first filling portion and the protective layer.

5. The display panel according to claim 4, wherein the display panel further comprises a touch control layer located between the encapsulation layer and the protective layer, the second filling portion is the color resistor, a top surface of the second filling portion away from the first filling portion is beyond a top surface of the extension portion away from the protective layer, a top surface of the first filling portion away from the touch control layer is located between a bottom surface of the protective layer close to the touch control layer and a top surface of the protective layer away from the touch control layer, and colors of color resistors in at least two adjacent grooves are different.

6. The display panel according to claim 2, wherein a third filling portion is further provided in the at least one groove, the third filling portion covers the first filling portion and the extension portion, a top surface of the third filling portion away from the extension portion is a flat surface, and a material of the third filling portion is different from materials of the first filling portion and the protective layer.

7. The display panel according to claim 1, wherein the display panel further comprises a touch control layer located between the encapsulation layer and the protective layer, a second filling portion is provided in the at least one groove, the second filling portion comprises a first portion, a second portion located on the first portion, a third portion located on the second portion, the first portion, the second portion and the third portion differ in material, an interface between the first portion and the second portion is located between a bottom surface of the protective layer close to the touch control layer and a top surface of the protective layer away from the touch control layer, and an interface between the second portion and the third portion is located between a bottom surface of the extension portion close to the protective layer and a top surface of the extension portion away from the protective layer.

8. The display panel according to claim 7, wherein the plurality of color resistors comprises a red color resistor, a blue color resistor, and a green color resistor, the first portion is the blue color resistor, the second portion is the red color resistor, and the third portion is the green color resistor.

9. The display panel according to claim 1, wherein a second filling portion is provided in the at least one groove, the display area comprises two opposing first sides and two opposing second sides, the first sides intersect with the second sides, a plurality of grooves are arranged around the display area, materials of the second filling portions in at least two adjacent grooves are different, each of the grooves comprises a first section close to the first side and a second section close to the second side, the first section and the second section are disposed space apart from each other at the junction of the first side and the second side, an arrangement order of a plurality of first sections close to one of the first sides is opposite to an arrangement order of a plurality of first sections close to another of the first sides, and an arrangement order of a plurality of second sections close to one of the second sides is opposite to an arrangement order of a plurality of the second sections close to another of the second sides.

10. The display panel according to claim 1, further comprising a barrier wall located within the non-display area, wherein the encapsulation layer comprises a first inorganic layer, a second inorganic layer, and an organic layer located between the first inorganic layer and the second inorganic layer, the first inorganic layer and the second inorganic layer are located over the barrier wall, the organic layer is located at a side of the barrier wall close to the display area, and the at least one groove is located at a side of the barrier wall away from the display area.

11. The display panel according to claim 1, wherein a thickness of the extension portion ranges from 1 micron to 1.5 micron, a depth of the groove is 3 to 4 times the thickness of the extension portion, and a width of the groove is larger than 10 microns.

12. The display panel according to claim 1, wherein distances between a plurality of grooves are gradually reduced in the direction from the display area to the non-display area.

13. A display device comprising a display panel, wherein the display panel comprises a display area and a non-display area surrounding at least one side of the display area, the display panel comprises:

a light emitting device layer comprising a plurality of light emitting portions located in the display area;

an encapsulation layer on the light emitting device layer;

a protective layer on the encapsulation layer; and a color filter layer disposed on the protective layer, the color filter layer comprising a light shielding layer and a color resist layer, the light shielding layer comprising a body portion located in the display area and an extension portion located in the non-display area, the body portion being provided with a plurality of openings corresponding to the plurality of light emitting portions, the color resist layer comprising a plurality of color resistors, and at least one of the color resistors being located in a corresponding opening of the plurality of openings, and wherein the protective layer is provided with at least one groove located in the non-display area, and the light shielding layer is disconnected at the at least one groove in the non-display area.

14. The display device according to claim 13, wherein a first filling portion is provided in the at least one groove, and a material of the first filling portion is different from a material of the protective layer.

15. The display device according to claim 14, wherein the material of the first filling portion is the same as that of the body portion, and the first filling portion is disposed space apart from the body portion.

16. The display device according to claim 14, wherein a second filling portion is further provided in the at least one groove, the second filling portion covers the first filling portion, and a material of the second filling portion is different from materials of the first filling portion and the protective layer.

17. The display device according to claim 16, wherein the display panel further comprises a touch control layer located between the encapsulation layer and the protective layer, the second filling portion is the color resistor, a top surface of the second filling portion away from the first filling portion is beyond a top surface of the extension portion away from the protective layer, a top surface of the first filling portion away from the touch control layer is located between a bottom surface of the protective layer close to the touch control layer and a top surface of the protective layer away from the touch control layer, and colors of color resistors in at least two adjacent grooves are different.

18. The display device according to claim 14, wherein a third filling portion is further provided in the at least one groove, the third filling portion covers the first filling portion and the extension portion, a top surface of the third filling portion away from the extension portion is a flat surface, and a material of the third filling portion is different from materials of the first filling portion and the protective layer.

19. The display device according to claim 13, wherein the display panel further comprises a touch control layer located between the encapsulation layer and the protective layer, a second filling portion is provided in the at least one groove, the second filling portion comprises a first portion, a second portion located on the first portion, a third portion located on the second portion, the first portion, the second portion and the third portion differ in material, an interface between the first portion and the second portion is located between a bottom surface of the protective layer close to the touch control layer and a top surface of the protective layer away from the touch control layer, and an interface between the second portion and the third portion is located between a bottom surface of the extension portion close to the protective layer and a top surface of the extension portion away from the protective layer.

20. The display device according to claim 13, wherein a second filling portion is provided in the at least one groove, the display area comprises two opposing first sides and two opposing second sides, the first sides intersect with the second sides, a plurality of grooves are arranged around the display area, materials of the second filling portions in at least two adjacent grooves are different, each of the grooves comprises a first section close to the first side and a second section close to the second side, the first section and the second section are disposed space apart from each other at the junction of the first side and the second side, an arrangement order of a plurality of first sections close to one of the first sides is opposite to an arrangement order of a plurality of first sections close to another of the first sides, and an arrangement order of a plurality of second sections close to one of the second sides is opposite to an arrangement order of a plurality of the second sections close to another of the second sides.

* * * * *